United States Patent [19]

Schubotz

[11] 3,876,891

[45] Apr. 8, 1975

[54] MOUNTING FOR ROD-LIKE CRYSTAL OSCILLATORS

[76] Inventor: Peter Schubotz, Eberwurzstrasse 89, 8000 Munich 45, Germany

[22] Filed: Jan. 22, 1973

[21] Appl. No.: 325,363

Related U.S. Application Data

[63] Continuation-in-part of Ser. No. 171,484, Aug. 13, 1971.

[30] Foreign Application Priority Data

Aug. 14, 1970 Germany ............................ 2040614

[52] U.S. Cl. ............................................... 310/9.4

[51] Int. Cl. ............................................... H04r 17/00

[58] Field of Search ........................ 310/8.2, 9.1–9.4, 310/9.7, 9.8

[56] References Cited

UNITED STATES PATENTS

| | | | |
|---|---|---|---|
| 2,953,696 | 9/1960 | Ruggles | 310/9.1 |
| 3,054,915 | 9/1962 | Houck | 310/9.1 |
| 3,185,870 | 5/1965 | Stoddard | 310/9.4 |
| 3,221,189 | 11/1965 | Brandt et al. | 310/9.1 |

*Primary Examiner*—Mark O. Budd
*Attorney, Agent, or Firm*—Hill, Gross, Simpson, Van Santen, Steadman, Chiara & Simpson

[57] ABSTRACT

Piezoelectric crystal rod oscillator is supported within a housing by and between electrical conductors which are attached rigidly in electrically isolated manner within opposite end portions of the housing such that the oscillator is maintained in mechanically stable relation within the housing. This is effected in a manner enabling use as a closure plate for the housing a standardized transistor housing base plate.

1 Claim, 5 Drawing Figures

MOUNTING FOR ROD-LIKE CRYSTAL OSCILLATORS

CROSS REFERFERENCE TO RELATED APPLICATION

This application is a continuation-in-part of application Ser. No. 171,484, filed Aug. 13, 1971.

This invention relates to mounting means for rod-like crystal oscillators, and is more particularly concerned with the mounting of piezoelectric crystal rod oscillators in stable relation within compact housings.

Substantial manufacturing advantage and economy can be attained by utilizing electro-technical components which have attained definitive standards in the industry. Among such components are transistor housing base plates of which dimensions have been standardized. Among similar and related uses for such standardized base plates is the closure of piezoelectric crystal rod oscillator housings. This entails the problem, by way of example, that due to the relatively small dimensions of such base plates it is difficult to maintain the crystal oscillator mechanically stable with its axis oriented perpendicularly to the base plate, and more particularly of attaining a suitable mounting which will lend itself readily to advantageous mass production methods of manufacture.

It is, accordingly, an important object of the present invention to solve the problem of providing a mounting for rod-like crystal oscillators with the use of available, standardized transistor housing base plates or disks.

Another object of the invention is to provide a new and improved mounting for piezoelectric crystal rod oscillators.

A further object of the invention is to provide a new and improved rod oscillator mounting in thoroughly stable relation within a housing.

Still another object of the invention is to provide a new and improved mounting of a piezoelectric crystal rod oscillator in a housing in an advantageous, low cost, efficient, reliable manner which will lend itself readily to mass production methods of manufacture.

Other objects, features and advantages of the invention will be readily apparent from the following description of certain preferred embodiments thereof, taken in conjunction with the accompanying drawing, although variations and modifications may be effected without departing from the spirit and scope of the novel concepts embodied in the disclosure, and in which.

Figure 1:
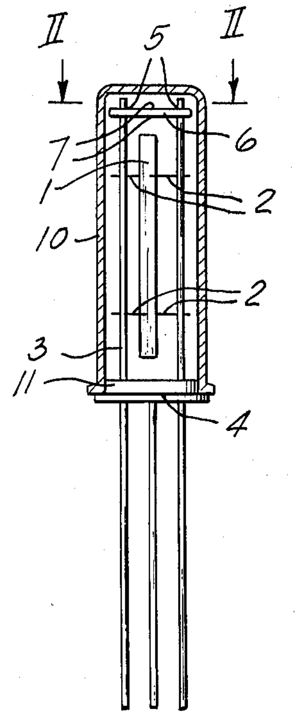
FIG. 1 is a vertical sectional elevational detail view on a substantially enlarged scale of one preferred embodiment of the invention.
Figure 2:
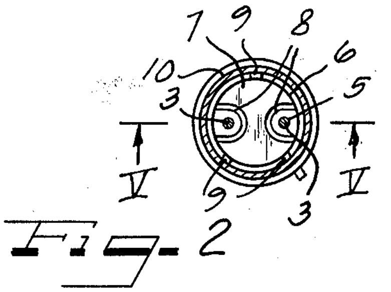
FIG. 2 is a transverse sectional detail view taken substantially along the line II—II of FIG. 1.
Figure 5:
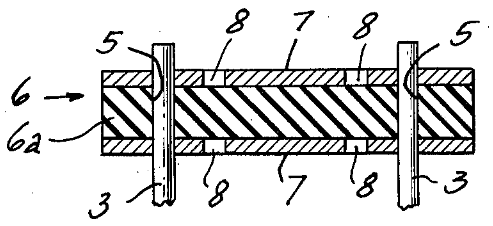
FIG. 5 is a horizontal sectional view taken generally along the line V—V of FIG. 2.

Referring to FIGS. 1, 2 and 5 a suitable length bar or rod-like piezoelectric oscillator crystal 1, such as quartz, is suspended for oscillation by means of fine conductor wire filament suspensors 2 by and between electrical conductor post means desirably in the form of suitable gauge substantially coextensive parallel extensions of wire conductors and of sufficient resistance to deformation to serve the intended function. As will be observed, one of the suspensors 2 extends to and between the oscillator 1 and the posts 3 adjacently spaced from each opposite end of the oscillator, extending transversely to the axes of the oscillator and the posts and each soldered fixedly on one hand to an electrode surface of the oscillator and on the other hand to the respective post, with the respective ends of the pairs of the suspensors attached to the oscillator being on respectively opposite sides of the oscillator so as to enable the desired oscillating action when the oscillator is excited by electrical potential through the posts and the suspensors.

Mounting of the posts 3 in a manner to implement not only their vibrator-supporting function but also their electrical conductor function and enabling then to serve as electrical connectors with circuitry of associated apparatus, a base disk structure 4 is provided through which the conductor post wires 3 extend and are rigidly secured in electrically isolated, insulated manner. In a desirable form, attaining advantageous economy in construction and manufacture, the base disk 4 comprises a standardized commercially available transistor housing bottom or base plate disk adapted to the instant purpose. The mounting and relationship of the elements is such that the vibrator 1 is disposed perpendicular to and with its adjacent end spaced from the base disk 4.

A mechanically substantially rigid frame relationship including the posts 3 and the base disk 4 is provided by the aid of means rigidly connecting the end portions of the posts 3 opposite the base 4 and extending freely beyond the end of the vibrator 1 remote from the base. To this end, such end portions extend fixedly through suitable respective apertures 5 in a disk 6 of a suitable form-stable dielectric material such that the posts will be electrically insulated from each other.

To facilitate miniaturization and economical manufacture, the disk 6 is desirably punched from a thin laminate and comprises an insulating core 6*a* (FIG. 5) and bilateral metallic facings 7. Thereby production of disks 6 is greatly facilitated because hundreds of pieces can be derived from a blank sheet or thin plate of the material. The metallic facings greatly facilitate the soldering operation by providing excellent soldered anchorage of the posts 3 at each metallized face of the disk 6. In order to effect electrical isolation of the posts 3 from one another and avoid any electrical connection therebetween by way of the metallic facings 7, areas of the metallic facings between the anchorage areas surrounding the perforations 5 are stripped from the insulating core. For example, generally semi-circular areas 8 may be thus stripped about each of the anchorage areas, and with the stripped areas running out at the edges of the disk so that there is no electrically conductive ridge or connection between the solder-anchorage areas.

In addition, means are provided on the frame disk 6 for nonelectrical stabilizing cooperation with enclosing housing means for the oscillator. To this end, the disk is outside of the anchorage areas provided with a plurality, such as three, suitably circumferentially spaced peripheral radially extending spacer projections or lugs 9 adapted to engage firmly with the inner wall of an elongated generally cup-shaped shroud or cap shell 10 which may be constructed as a drawn metal member of an inside diameter to clear the perimeter of the disk 6 and of a length to clear the ends of the posts 3 at its closed end while its open end is engaged and secured within a rabbet 11 provided in the perimeter of the base disk 4. The lugs 9 are so arranged and dimensioned that upon insertion of the vibrator frame into the cap 10, the lugs are slightly deformably compressed and efficiently center and firmly hold the frame structure against vibrating relative to the cap so that undesirable changes in capacitance may not take place between the surfaces of the vibrator 1 and the housing wall.

Figure 3:
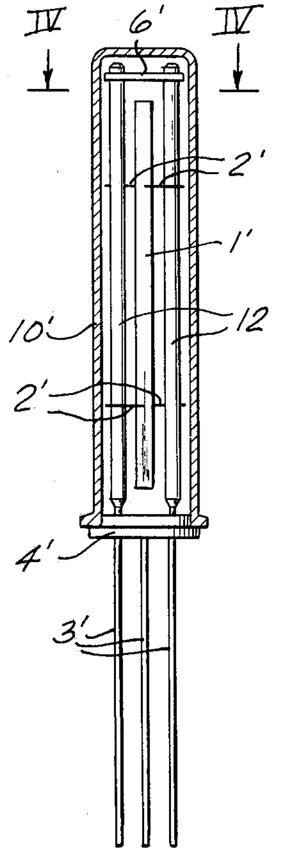
FIG. 3 is a vertical sectional view illustrating a modified construction embodying the invention.
Figure 4:
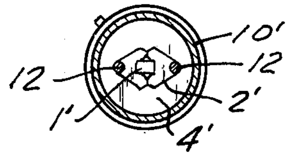
FIG. 4 is a transverse sectional detail view taken substantially along the line IV—IV of FIG. 3.

Refering to FIGS. 3 and 4, a slightly modified structure is depicted in which an especially long bar or rod-like crystal oscillator 1' must be mounted. For this purpose, to maintain adequate stability, means of increased stiffness are provided in pin-like posts 12 which take the place of the simple conductor wire posts 3 in the oscillator-supporting frame, with stub end portions of the conductor wires 3' extending into the housing 10' through the base disk 4' being electrically connected to the pin posts 12 as by means of hard soldering. Such hard soldering can advantageously be accomplished simultaneously with the fusing-in of the connecting wires 3'. The additional fixing of the free ends of the frame pins 12 is accomplished in the same manner as in FIG. 1 where the frame employs the connecting wires themselves for supporting the crystal rod-like oscillator, namely, electrically conductive filament suspensors 2' connect the oscillator 1' to the post pins 12, and the frame head disk 6' rigidly connects the free end portions of the post pins together and effects a lug-tight stabilizing engagement with the inner end portion of the housing cup 10'.

In both forms of the invention highly advantageous mechanical stability in the mounting for the oscillator member is attained not only because the supporting rods therefor are held in fixed spaced relation adjacent to each opposite end of the oscillator, but also because the supporting rod spacers are fixedly held against displacement movement relative to the housing from whatever cause, whether endwise thrusts or shocks or transverse shocks or vibrations. Additionally, the assembly is substantially insensitive to fluctuations in temperature, not only because there is relatively similar coefficient of expansion of at least the housing cap shell member and the metal-faced frame head disk, but also because the head disk is peripherally spaced from the housing shell except for the small areas of lug contact which are sufficiently resiliently yieldable relative to the housing shell to maintain firm contact therewith even in extremes of temperature variation.

The mounting is, in particular, insensitive to temperature fluctuations according to another feature of the invention, even if such fluctuations reach an extreme level. The metal layers 7 on each side of the thin laminate core *6a* of the disk 6 and the metal cap shell 10 have the same, or nearly the same thermal coefficient of expansion and thus expand and contract approximately the same extent. The dimensioning of the metallic facing 7 and the disk core *6a* is such that the temperature response of the metallic facing 7 is forced upon the thin laminate so that the laminate expands or contracts with the metallic facings even though it has a different thermal coefficient. The thickness of the thin laminate core *6a* depends on the diameter of the cap shell 10. The thickness should be selected such that the disk has a sufficient thickness in relation to its diameter for sufficient stiffness and the like. For example, for a 5 mm disk, a 0.3 mm thickness is sufficient. The expansion and contraction of the bilateral metal coatings 7 which force expansion and contraction of the thin laminate core *6a* may be realized by utilizing the teachings in the book *Introduction to Printed Circuits*, by Robert L Swiggett, published by John F. Rider, Publisher, Inc. New York, Library of Congress Card Catalog Number 56-11841. Reference may be taken to page 25, Table I of that publication for suitable layer techniques. According to the present invention, however, the laminate is metallized on both sides. In a particular construction, such as exemplified above, a copper layer was provided on each side and reinforced by galvanic deposition to a thickness of approximately 0.1 mm. As will be apparent from the foregoing, all of the stated objects of the invention, among others, are attained to excellent advantage.

Although I have described my invention by reference to specific illustrative embodiments, many changes and modifications of my invention may become apparent to those skilled in the art without departing from the spirit and scope thereof. I therefore intend to include within the patent warranted hereon all of the changes and modifications as may reasonably and properly be included within the scope of my contribution to the art.

I claim:

1. Mounting means for rod-like oscillators of the type wherein a housing base plate has connecting wires extending therethrough, an oscillator rod is arranged parallel with and between post extensions from the wires and connected to the post extensions by means of wire filament suspensors extending transversely to the axis of the rod and soldered to the electrode surfaces of the rod and to the post extensions, a drawn metal substantially cup-shaped housing shell enveloping the rod and post extensions is connected to the base plate, and a disc having perforations for receiving the free ends of the post extensions includes circumferentially spaced projections on the perimeter thereof engaging the housing shell and maintaining the remainder of the perimeter of said disc in spaced relation to said housing shell, the improvement therein wherein:

said disc comprises a punched thin laminate including an insulating core and bilateral metallic facings on said core;

said metallic facings and the housing shell having like thermal coefficients of expansion and thus similarly respond to temperature change, the dimensioning of the metallic facings and the disc core being such that the temperature response of the metallic facings is forced upon the thin laminate so that the laminate expands or contracts with the metallic facings even though it has a different thermal coefficient; and each of said metallic facings including a pair of arcuate gaps concentric with respective ones of said perforations.

* * * * *